(12) United States Patent
Yuasa (10) Patent No.: US 6,443,748 B1
(45) Date of Patent: Sep. 3, 2002

(54) ELECTRICAL CONNECTION BOX FOR A VEHICLE

(75) Inventor: Eriko Yuasa, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 09/962,215

(22) Filed: Sep. 26, 2001

(30) Foreign Application Priority Data

Sep. 27, 2000 (JP) ........................................ 2000-294565

(51) Int. Cl.[7] .............................. H01R 4/60; H01R 4/64; H01R 9/22; H01R 33/00
(52) U.S. Cl. .......................... 439/205; 439/709; 439/34
(58) Field of Search ................................ 439/206, 205, 439/709, 34, 519

(56) References Cited

U.S. PATENT DOCUMENTS

| | | | | |
|---|---|---|---|---|
| 5,288,141 A | * | 2/1994 | Isshiki et al. ............. 303/119.1 |
| 5,427,550 A | * | 6/1995 | Jaag ............................ 439/709 |
| 5,451,170 A | * | 9/1995 | Suffi ............................ 439/404 |
| 5,458,496 A | * | 10/1995 | Itou et al. ..................... 439/34 |
| 5,785,532 A | * | 7/1998 | Maue et al. ................... 439/34 |
| 5,876,243 A | * | 3/1999 | Sangawa .................. 200/51 R |
| 6,065,988 A | * | 5/2000 | Kubota ........................ 439/248 |
| 6,074,240 A | * | 6/2000 | Bradshaw et al. .......... 439/412 |
| 6,166,450 A | * | 12/2000 | Watanabe et al. .......... 307/10.1 |
| 6,224,430 B1 | * | 5/2001 | Kusuda et al. .............. 439/709 |
| 6,227,903 B1 | * | 5/2001 | Horton ........................ 439/49 |
| 6,238,225 B1 | * | 5/2001 | Middlehurst et al. ....... 439/212 |
| 6,319,057 B2 | * | 11/2001 | Sekido et al. ............... 439/190 |

* cited by examiner

*Primary Examiner*—P. Austin Bradley
*Assistant Examiner*—Edwin A. León
(74) *Attorney, Agent, or Firm*—Oliff & Berridge PLC (57) ABSTRACT

An electrical connection box for a vehicle has a casing and at least one bus bar within the casing to which in use a high nominal maximum voltage of not less than about 14V and not more than about 200V is applied. On the upper wall of the casing, there is a relay accommodation structure an upstanding walls defining first and second recesses at which positive and negative terminals of the relay are inserted in use. The recesses are partitioned from each other by one upstanding wall which has an upper edge at which an inclined groove is provided for carrying away water by gravity. Thereby risk of leak currents is minimized.

4 Claims, 6 Drawing Sheets

ELECTRICAL CONNECTION BOX FOR A VEHICLE

BACKGROUND OF THE INVENTION

1. Field of Invention

The present invention relates to an electrical connection box which is suitable to be mounted on a vehicle, particularly an electrical connection box to which a high voltage is to be applied, and to a vehicle having such a box installed.

2. Description of Related Art

Normally one secondary, i.e. rechargeable, battery having a rated voltage of 12V and a maximum nominal voltage of 14V is mounted on an automobile of the internal combustion engine type. A voltage up to the maximum voltage of 14V is applied from the battery to a circuit composed of bus bars and the like that are accommodated in an electrical connection box. The power supply is distributed by the internal circuit of the electrical connection box. The operation of electric/electronic component parts mounted on the vehicle is controlled through electric wires connected with the internal circuit.

On a goods vehicle, such as a lorry or truck, a rated voltage of 24V and a maximum voltage of 28V are applied to a circuit by a battery structure.

In recent years, electric/electronic component parts have been mounted in increasing numbers on a vehicle, and there is an increase in the electric current which is applied to one electric/electronic component part. For example, the electric power required to drive a fan is conventionally 130 watts, but has become 260 watts in recent years. At the rated voltage of 12V of the battery, it is impossible to operate suction and exhaust devices of an engine, electromotive power steering, and the like devices, requiring a high voltage such as 36V. Therefore, they are mechanically operated by the driving force of the engine.

With the increase of the electric current applied to each electric/electronic component part, the diameter of the electric wires used has become larger. Further, with rapid increase of the number of electric/electronic component parts, the number of electric wires has increased recently, which has increased the diameter of a wire harness having a bundle of electric wires. Consequently, the weight of the electric wires to be wired on a vehicle body has increased.

As described above, if the power supply from the battery is incapable of operating the suction and exhaust devices of the engine, they are mechanically operated. In this case, it is impossible to accomplish fine control of the operation of the suction and exhaust devices. Further, much fuel is consumed, which pollutes the environment. Accordingly, it is preferable to operate the suction and exhaust devices of the engine and the like not mechanically but electrically by the power supply from the battery.

In the case where the circuit is so constructed that a voltage higher than 14V can be applied to the circuit of the electrical connection box composed of bus bars and the like, it is possible to reduce the required electric current and thus the diameter of the electric wires and the size of a bundle of a plurality of electric wires (wire harness). Therefore, it is possible to reduce the weight of the electric wires.

Further, with the application of a high voltage to a circuit composed of bus bars and the like, it is possible to control the operation of the suction and exhaust devices, the power steering motor, and the like not mechanically or hydraulically but electrically. In this case, it is possible to accomplish fine control of the operation of suction and exhaust devices and the like. Further, fuel consumption can be reduced, which reduces pollution.

It is preferable to apply a high voltage of about 42V to the electromotive power steering motor, the suction and exhaust devices of the engine, the fan, and other devices requiring a high voltage. On the other hand, in an automobile, it is preferable to apply the rated voltage of 12V (maximum voltage: 14V) to signal-generating devices of the electric/electrical component parts and coils of relays.

Water is liable to penetrate into terminal recesses of a relay accommodation structure at the exterior of an electrical connection box mounted in a vehicle from a wall partitioning the recesses from each other. In the case where a circuit to which a high voltage of for example about 42V is applied is connected to a relay mounted in the relay accommodation structure, a leak current is liable to be generated between terminals of the relay to which the high voltage of, for example, about 42V is applied. This is because water penetrates into a positive (+) terminal insertion portion of the relay accommodation part and a negative (−) terminal insertion portion thereof from a partitioning wall partitioning them from each other. From there, water may also penetrate into the box to cause leak currents between bus bars.

SUMMARY OF THE INVENTION

Therefore, it is an object of the present invention to reduce or avoid the risk that water penetrates into the terminal recesses or into a gap between high-voltage bus bars from a relay accommodation part to thereby prevent a leak current from being generated, particularly in the case where an electrical connection box is provided with a circuit to which a high voltage is applied.

According to the present invention, there is provided an electrical connection box having a casing having an upper wall, at least one bus bar which is mounted within the casing and to which in use a nominal maximum voltage of not less than 14V and not more than 200V is applied and, on the upper wall of the casing, a relay accommodation structure adapted to receive in use at least one electrical relay and comprising upstanding walls defining at least a first recess at which a positive terminal of the relay is to be inserted and a second recess at which a negative terminal of the relay is to be received, the first and second recesses being partitioned from each other by one of the upstanding walls which has an upper edge at which an inclined groove is provided for carrying away water by gravity.

With this construction, water which lodges on the upper edge of the partition wall partitioning the respective terminal insertion recesses of the relay accommodation structure flows into the inclined groove and moves by gravity to the exterior of the relay accommodation structure. Accordingly, it is possible to reduce or prevent water from penetrating into the positive (+) or negative (−) terminal insertion recesses. Consequently, it is possible to prevent the water from penetrating into gaps between the high-voltage bus bars.

The groove may be formed on the upper edge or end surface of the partition wall so as to slope in one direction only along the wall between the terminal insertion portions, or may have a higher central portion and extend linearly downward in two directions to the exterior of the relay accommodation part. That is, it is preferable to configure the groove in such a way that water which lodges on the partitioning wall flows linearly downward through the groove to the exterior of the relay accommodation part.

It is preferable that the high voltage to be applied to the high-voltage bus bar is at least about 28V, particularly about 42V. In this case, it is easy to provide the voltage applied to the high-voltage bus bar at 42V by connecting in series three batteries each having a rated voltage of about 12V (nominal maximum voltage: 14V) generally used in automobiles. Needless to say, it is possible to use a single battery having a maximum voltage of about 42V. The reason why the high voltage to be applied to the high-voltage bus bar is set to about 42V is partly because using a voltage close to or above 50V for the high-voltage bus bar may be dangerous. The present inventors have conducted salt water experiments in order to ascertain the degree of risk when applying a voltage of 42V in an electrical junction box suitable for use in an automobile engine compartment. The experiments were done as follows:

1 ml of salt water was injected into each terminal hole of the casing of a junction box which had bus bars disposed inside. Electrical components such as relay, fuse, connectors, etc. were mounted on the casing. A voltage of 42V was applied to bus bars of the junction box for 8 hours and then suspended for 16 hours. This was repeated twice. There was initially no change to the bus bars and electrical components. After the third repetition, it was found that extra electric current passed between the bus bars generating heat and a portion of bus bars was melted. The heat also melted resin around bus bars such as an insulation plate, casing and resin portion of electrical components adjacent the casing.

Accordingly, since damage did not occur until after the third exposure to salt water, it was confirmed that in consideration of conditions under normal use of an automobile, the application of the electric power at 42V to the electric/electronic component parts should not cause a problem.

BRIEF DESCRIPTION OF THE DRAWINGS

Embodiments of the present invention will now be described by way of example with reference to drawings, in which:

FIG. 6 shows a relay accommodation structure of a further embodiment of the present invention, FIG. 6A being a perspective view, FIG. 6B a sectional view on line B—B of FIG. 6A, and FIG. 6C a sectional view on line C—C of FIG. 6B.

DETAILED DESCRIPTION OF PREFERRED EMBODIMENTS

Figure 1:
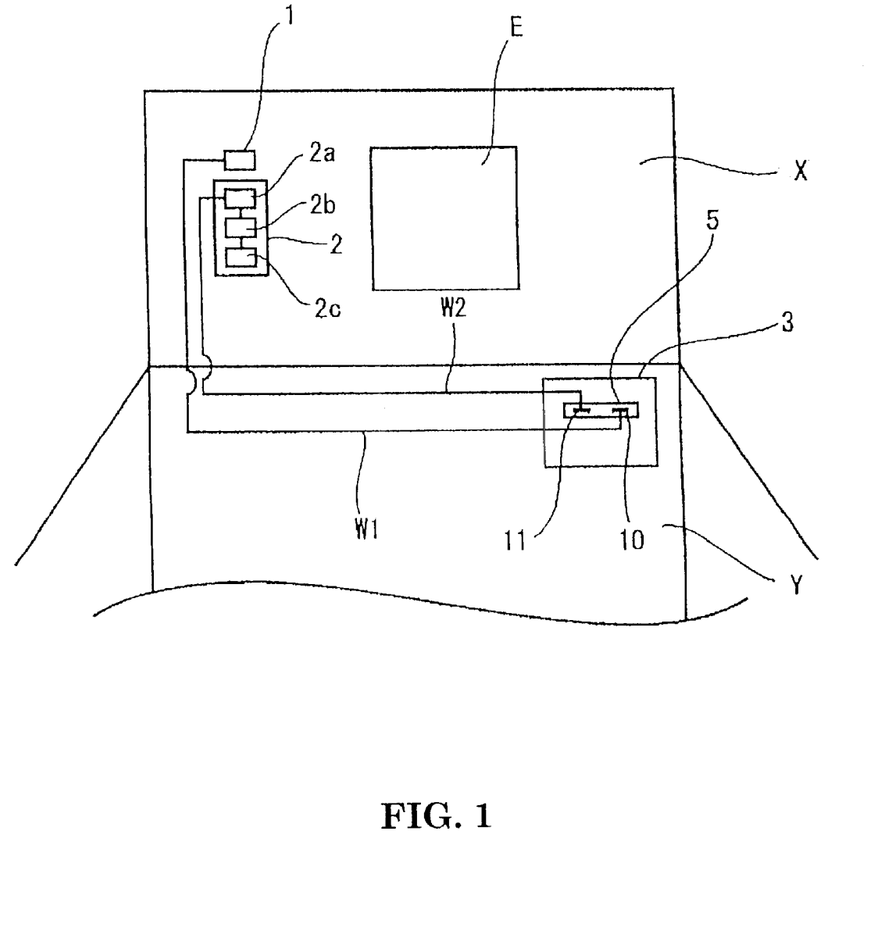
FIG. 1 is a diagram showing application of an embodiment of the present invention.

As schematically shown in FIG. 1, in an automobile to which the present invention is applied, an engine E mounted in an engine compartment X provides drive of the vehicle and generates electrical power, e.g. through a conventional alternator (not shown). A low-voltage battery structure 1 and a high-voltage battery structure 2 are mounted in the engine compartment X, and are charged by the alternator. The low-voltage battery structure 1 includes a conventional general-purpose rechargeable battery having a rated voltage 12V and a nominal maximum voltage of 14V. The high-voltage battery 2 includes three battery units 2a, 2b and 2c connected in series to generate a nominal maximum voltage of about 42V. Each of the three battery units, 2a, 2b and 2c have a rated voltage of about 12V (nominal maximum 14V). Such 12V rechargeable (secondary) battery units are conventional. Needless to say, it is possible to use a single battery having a maximum voltage of 42V. The batteries 1 and 2 and their connections to the alternator are conventional and need not be described in detail here.

The low-voltage battery structure 1 is connected to low-voltage bus bars 10 accommodated in an electrical connection box 3 in the form of a junction box mounted in the vehicle interior Y (or, depending on the vehicle, in the enginecompartment) to apply a low voltage (maximum voltage: about 14V) to the low-voltage bus bars 10.

The high-voltage battery structure 2 is connected to high-voltage bus bars 11 accommodated in the same electrical connection box 3 to apply a high voltage (maximum voltage: about 42V) to the high-voltage bus bars 11.

The load side of the high-voltage bus bars 11 is connected to electrical devices or actuators to operate them electromotively. The actuators (not shown) include a power steering motor, suction and exhaust devices of the engine, and like devices that consume high power. The load side of the low-voltage bus bars 10 is connected to appliances (not shown), such as sensors, lamps, and like devices, consuming relatively low power, such as are typically provided in an automobile.

Figure 2:
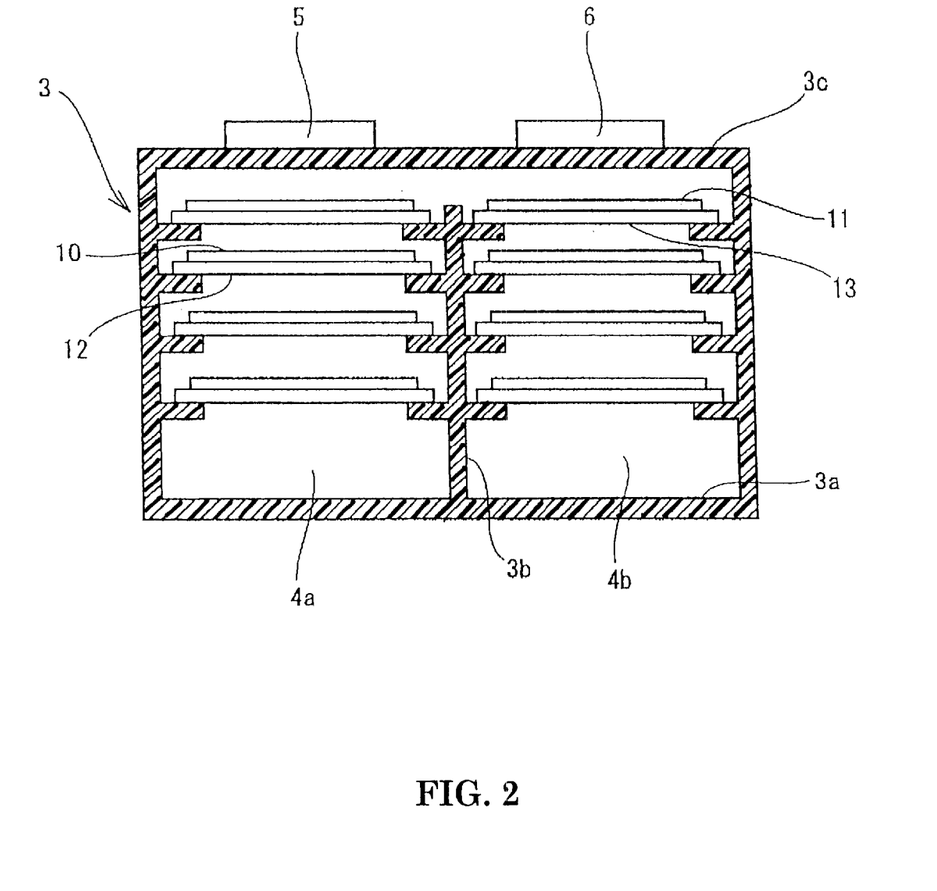
FIG. 2 is a sectional view of an electrical connection box to which the invention is applied.

As shown in FIG. 2, the electrical connection box 3 has a casing providing two compartments 4a and 4b separated by a partition wall 3b standing up from a bottom wall 3a. The compartment 4a accommodates insulation plates 12 carrying the low-voltage bus bars 10 one above another, while the compartment 4b accommodates the insulation plates 13 carrying the high-voltage bus bars 11 also one above another.

On the outer surface of an upper wall 3c of the casing of the electrical connection box 3, there is provided a relay accommodation structure 5 at which in use the low-voltage bus bars 10 and electrical relays are connected to each other, and a relay accommodation structure 6 at which in use the high-voltage bus bars 11 and electrical relays are connected to each other. In the relay accommodation structures 5 and 6, tabs formed by bending the bus bars 10 and 11 are connected to terminals of the relays directly or through relay terminals. The relays, which are not shown, are typically of a conventional type and have terminals to be inserted at the relay accommodation structures.

Figure 3:
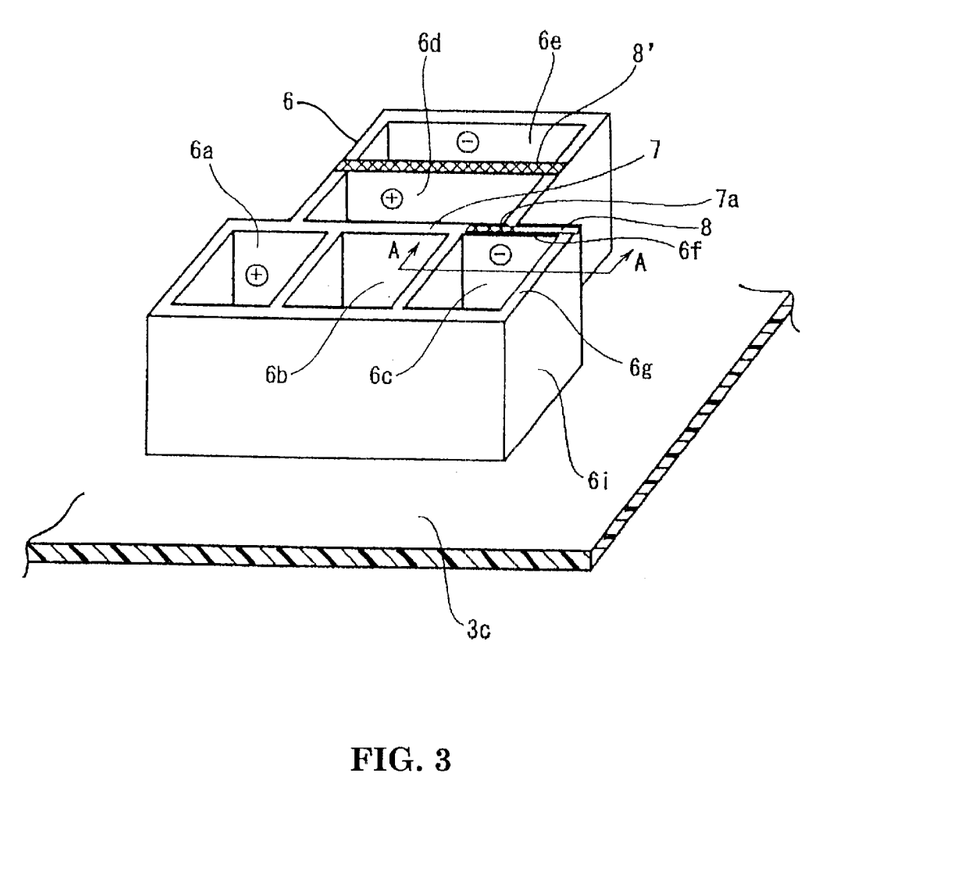
FIG. 3 is an enlarged perspective view showing a relay accommodation structure in an electrical connection box which is a first embodiment of the present invention.

As shown in FIG. 3, the relay accommodation structure 6 for the high-voltage bus bar 11 has upstanding walls, integral with the casing wall 5a, defining a positive (+) terminal insertion recess 6a, a vacant terminal insertion recess 6b, and a negative (−) terminal insertion recess 6c arranged in a row in parallel with one another, with partition walls partitioning them from one another; and a positive (+) terminal insertion recess 6d and a negative (−) terminal insertion recess 6e arranged in a row in parallel with one another, with a partition wall partitioning them from each other. Thus the terminal insertion recesses 6a, 6b, 6c, 6d, 6e and are arranged in the shape of a letter T. The positive (+) terminal insertion recess 6d is adjacent to all of the positive (+) terminal insertion recess 6a, the vacant terminal insertion recess 6b, and the negative (−) terminal insertion recess 6c through a partition wall 7. The upstanding walls defining the insertion portions are formed unitarily with the upper walls 3c of the box, by plastics moulding.

Figure 4A:
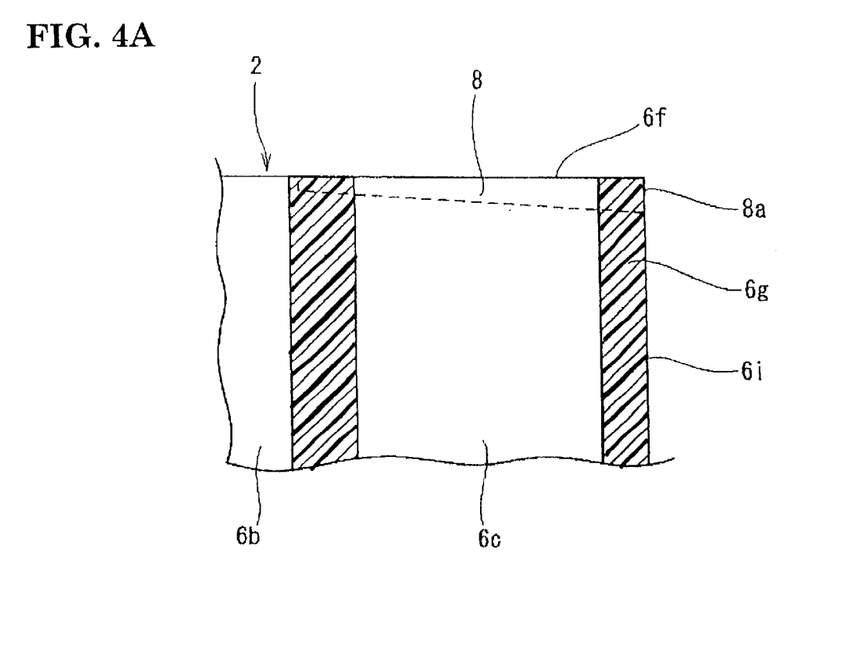
FIG. 4A is an enlarged partial sectional view on line A—A of FIG. 3
Figure 4B:
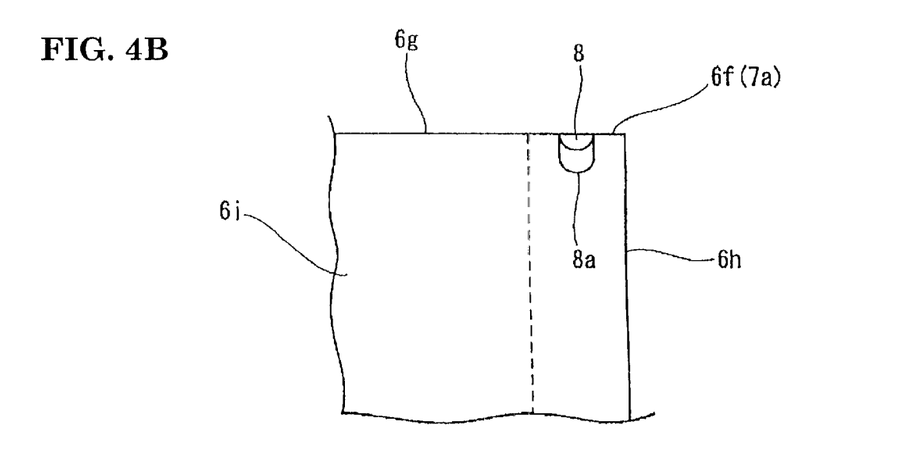
FIG. 4B is a partial side view on the right-hand side of FIG. 3.

As shown in FIGS. 4A and 4B, an approximately semi-circular section groove 8 (also seen in FIG. 3) is formed on the upper end surface of a positive/negative (+−) boundary portion 7a of the partition wall 7 partitioning the positive (+) terminal insertion recess 6d and the negative (−) terminal insertion recess 6c from each other by forming the central portion of the positive/negative (+−) boundary portion 7a lower than both edges over the whole length of the boundary portion 7a. The groove 8 extends linearly downward to an outer surface 6i of a side wall 6g of the negative (−) terminal insertion recess 6c perpendicular to a side wall 6f thereof through the upper end surface of the side wall 6f continuous with the positive/negative (+−) boundary portion 7a. The groove 8 penetrates through the upper end surface of the side wall 6g to the outer surface 6i to form an opening 8a.

Figure 5A:
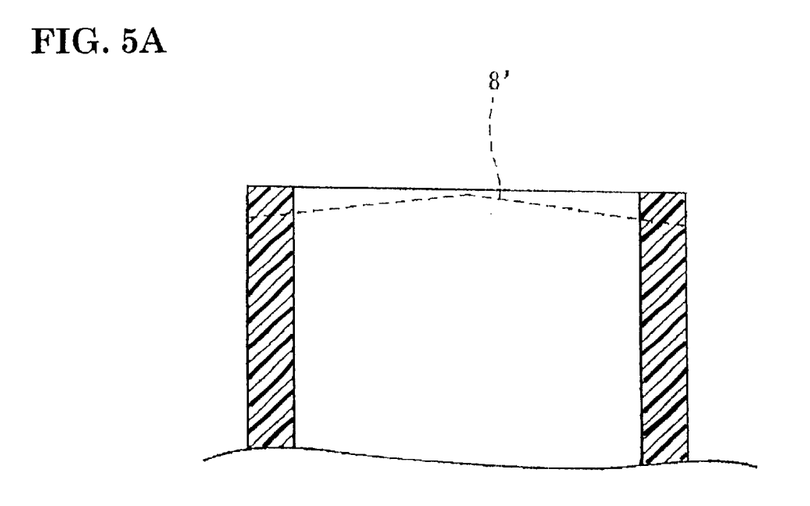
FIGS. 5A and 5B are enlarged sectional views showing alternative arrangements of the groove of the relay accommodation structure.
Figure 5B:
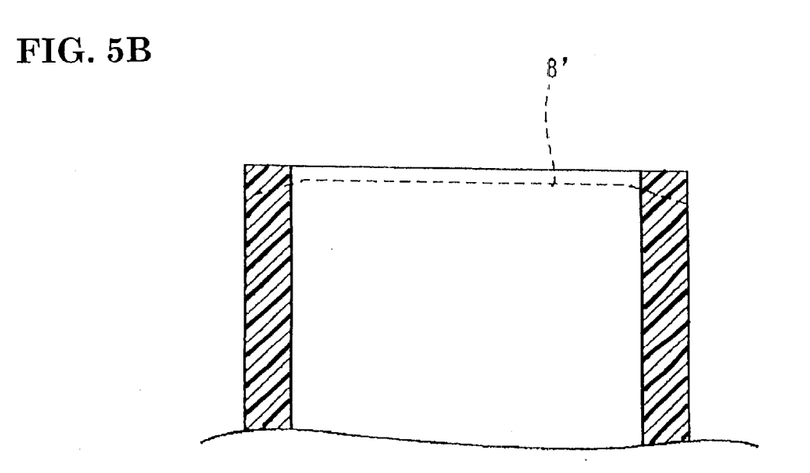

As shown in FIGS. 5A and 5B, a groove 8' is also formed on the partition wall 7 disposed between the positive (+) terminal insertion recess 6d and the negative (−) terminal insertion recess 6e. Both ends of the groove 8' incline downward toward the outside. The groove 8' may be so shaped that it inclines entirely from its center as shown in FIG. 5A or it inclines at only both ends as shown in FIG. 5B.

With this construction, water drops which collect on the upper edge of the positive/negative (+−) boundary portion 7a partitioning the positive (+) terminal insertion recess 6d and the negative (−) terminal insertion recess 6c adjacent thereto from each other, or water drops which collect on the upper edge of the partitioning wall 7 disposed between the positive (+) terminal insertion recess 6d and the negative (−) terminal insertion recess 6e, pass into the groove 8 (8') and flow along the groove thus dropping by gravity from the opening 8a toward the outer surface 6i of the side wall 6g or at the ends of the groove 8'. Accordingly, it is possible to prevent water drops from dropping to the positive (+) terminal insertion recess 6d disposed at one side of the positive/negative (+−) boundary portion 7a, the negative (−) terminal insertion recess 6c disposed at the other side of the positive/negative (+−) boundary portion 7a, and the negative (−) terminal insertion recess 6e. Consequently, it is possible to prevent generation of a leak current because the water is prevented from penetrating into the gap between the high-voltage bus bars 11. It is also possible to prevent the leak current from being generated between the terminals of the relays.

Figure 6A:
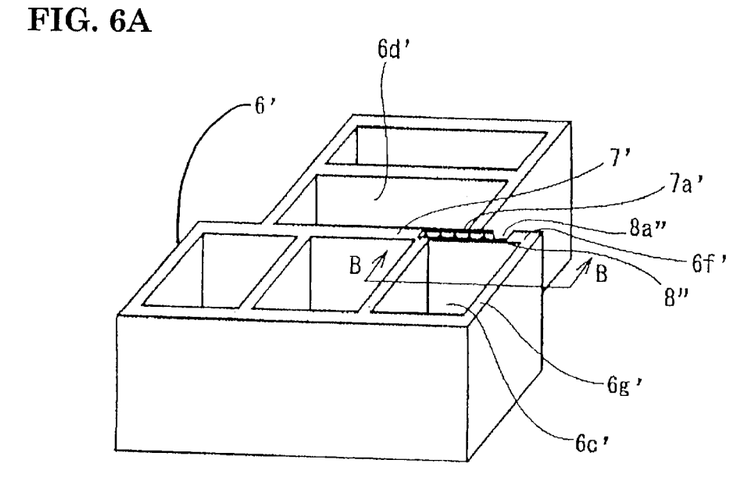
Figure 6B:
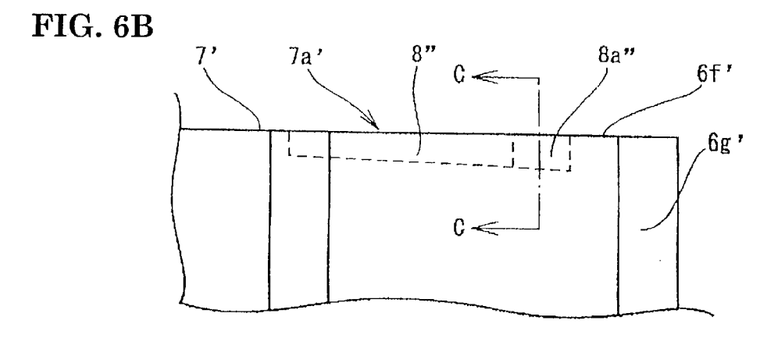
Figure 6C:
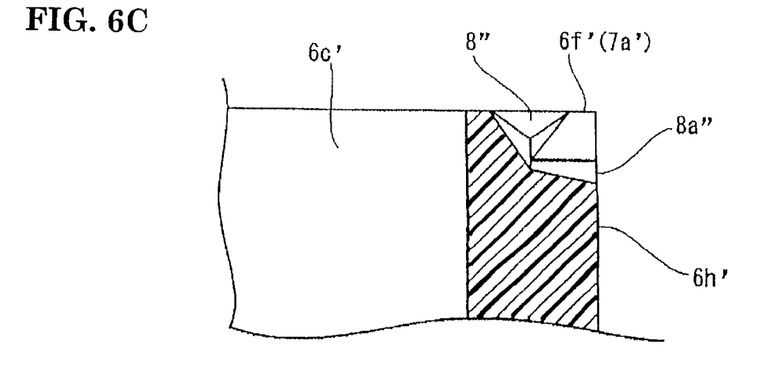

FIGS. 6A, 6B and 6C show a further embodiment, in which a groove 8" V-shaped in section may be formed on the upper end surface of a positive/negative (+−) boundary portion 7a' of a partition wall 7' of a relay accommodation structure 6'. On the upper end surface of a side wall 6f' the bottom surface of the groove 8" may incline downward toward an outer surface 6h' of the side wall 6f' to form an opening 8a" on the outer surface 6h'. The groove 8" may incline downward toward the opening 8a" over its whole length. In this construction, water which collects on the positive/negative (+−) boundary portion 7a" drops to the inclined groove 8' and flows through the groove 8" thus dropping from the opening 6a' to the outer surface 6h' of the side wall 6f' by gravity. Thus it is possible to reliably prevent water from entering the positive (+) terminal insertion recess 6d' or the negative (−) terminal insertion recess 6c'.

The circuits 5 of these embodiments are thus applied to an automobile on which the battery of the rated voltage of about 12V is mounted. However, in the case where a maximum voltage of about 28V is applied to a bus bar in the automobile or a larger vehicle such as a truck, the bus bar to which the voltage of about 28V may be applied is the low-voltage bus bar and the bus bar to which the voltage of about 42V may be applied is the high-voltage bus bar. The construction of the circuit 5 and connection box in this case is the same as that of the embodiments.

In the embodiments, the maximum voltage of about 42V is applied to the high-voltage bus bar 11. However, needless to say, a high voltage of 42V–200V can be applied to the high-voltage bus bars 11, provided that safety is ensured.

In the embodiments, the sectional configuration of the drain groove is semicircular or V-shaped, but may be rectangular, with its bottom surface having a plane configuration.

As apparent from the foregoing description, by the present invention, in the case where a high voltage is applied to the circuit of the electrical connection box accommodating the low-voltage bus bar and the high-voltage bus bar to reduce the diameter of an electric wire and that of a wire harness by reducing the amount of electric current, a groove is formed on the upper edge of the partition wall partitioning the positive (+) terminal insertion recess of the relay accommodation structure for connecting the high-voltage bus bar and the relay to each other from the negative (−) terminal insertion recess of the relay accommodation structure. The groove is formed in such a way that the groove inclines downward the outside of the relay accommodation structure. Therefore, water collecting on the upper edge of the partition wall can flow downward along the groove to the outside of the relay accommodation structure. Accordingly, it is possible to prevent water from penetrating into the positive (+) terminal insertion recess or the negative (−) terminal insertion recess from the gap therebetween. Consequently, it is possible to prevent water from penetrating into gaps between the high-voltage bus bars and hence prevent the generation of leak currents.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. An electrical connection boxcomprising:

a casing having an upper wall;

at least one bus bar which is mounted within said casing and to which in use a nominal maximum voltage of not less than about 14V and not more than about 200V is applied; and on said upper wall of said casing, a relay accommodation structure adapted to receive in use at least one electrical relay and comprising upstanding walls defining at least a first recess at which a positive terminal of the relay is to be inserted and a second recess at which a negative terminal of the relay is to be inserted, said first and second recesses being partitioned from each other by one of said upstanding walls which has an upper edge at which an inclined groove is provided for carrying away water by gravity.

2. An electrical connection box according to claim 1, wherein said nominal maximum voltage is about 42V.

3. A vehicle comprising:

an electrical power source providing a nominal maximum voltage of not less than about 14V and not more than about 200V;

an electrical connection box comprising:

a casing having an upper wall;

at least one bus bar which is mounted within said casing and to which in use a nominal maximum voltage of not less than about 14V and not more than about 200V is applied, said electrical power source being electrically connected to said bus bar; and on said upper wall of said casing, a relay accommodation structure adapted to receive in use at least one electrical relay and comprising upstanding walls defining at least a first recess at which a positive terminal of the relay is to be inserted and a second recess at which a negative terminal of the relay is to be inserted, said first and second recesses being partitioned from each other by one of said upstanding walls which has an upper edge at which an inclined groove is provided for carrying away water by gravity; and an electrical relay mounted at said relay accommodation structure and comprising positive and negative terminals respectively received in said first and second recesses.

4. A vehicle according to claim 3, wherein said nominal maximum voltage is about 42V.

* * * * *